(12) United States Patent
Yamamoto

(10) Patent No.: US 6,861,880 B2
(45) Date of Patent: Mar. 1, 2005

(54) DRIVING CIRCUIT FOR PUSH-PULL OPERATED TRANSISTORS

(75) Inventor: Tomohisa Yamamoto, Aichi-ken (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/637,562

(22) Filed: Aug. 11, 2003

(65) Prior Publication Data

US 2004/0061534 A1 Apr. 1, 2004

(30) Foreign Application Priority Data

Sep. 30, 2002 (JP) ........................................ 2002-286477

(51) Int. Cl.[7] ................................................ H03K 3/00
(52) U.S. Cl. ........................ 327/108; 327/170; 327/544
(58) Field of Search ........................ 327/108–112, 161, 327/170, 231, 233, 237, 379, 384, 389, 544; 326/21, 26, 27

(56) References Cited

U.S. PATENT DOCUMENTS

| | | | |
|---|---|---|---|
| 4,827,159 A | * 5/1989 | Naganuma | .................... 326/27 |
| 5,592,015 A | 1/1997 | Iida et al. | |
| 5,754,078 A | 5/1998 | Tamagawa | |
| 6,208,208 B1 | 3/2001 | Komatsu et al. | |
| 6,307,407 B1 | 10/2001 | Fukui | |
| 6,636,087 B2 | * 10/2003 | Miyazaki | .................... 327/108 |
| 2002/0060590 A1 | 5/2002 | Nitawaki | |

FOREIGN PATENT DOCUMENTS

| | | |
|---|---|---|
| JP | 5-152919 | 6/1993 |
| JP | 6-132797 | 5/1994 |
| JP | 6-267966 | 9/1994 |
| JP | 7-142989 | 6/1995 |
| JP | 7-297653 | 11/1995 |
| JP | 8-293740 | 11/1996 |
| JP | 8-307224 | 11/1996 |
| JP | 10-313587 | 11/1998 |
| JP | 11-308057 | 11/1999 |
| JP | 2000-262042 | 9/2000 |
| JP | 3161366 | 2/2001 |
| JP | 2002-158571 | 5/2002 |

* cited by examiner

Primary Examiner—Kenneth B. Wells
(74) Attorney, Agent, or Firm—Posz & Bethards, PLC

(57) ABSTRACT

A driving circuit having a p-n-p transistor and an n-p-n transistor which are connected in series between a high-voltage side source terminal ($V_B$) and a ground terminal, and a plurality of inverters provided on a path through which an input signal is transmitted to both the transistors. One of both the transistors is turned on, and the other is turned off, by means of the inverters to bring an output terminal connected between both the transistors, to any of a high voltage level and a low voltage level. The inverters are each constituted of a bipolar transistor which is element-isolated by silicon oxide layers in an n-silicon layer, and, in addition to inverters each having in the n-silicon layer a p+ substrate region for drawing out electric charges, inverters which do not have the p+ substrate region are provided in combination with the former.

16 Claims, 10 Drawing Sheets

DRIVING CIRCUIT FOR PUSH-PULL OPERATED TRANSISTORS

BACKGROUND OF THE INVENTION

1. Field of the Invention

This invention relates to a driving circuit.

2. Description of the Prior Art

In driving circuits in charging pump booster circuits, two transistors connected in series between high-voltage and low-voltage both source terminals simultaneously come into a conducting state when both the transistors are push-pull operated, whereupon a leak-through current flows (see, e.g., Japanese Patent Application Laid-open No. 2000-262042, corr. to U.S. Pat. No. 6,307,407). This phenomenon is described below with reference to FIGS. 11 to 13.

As shown in FIG. 11, a bipolar transistor 100 and a bipolar transistor 101 are connected in series between a high-voltage side source terminal ($V_B$) and a ground terminal, and also a midpoint between a resistance element 102 and a transistor 103 which are connected in series between the high-voltage side source terminal ($V_B$) and the ground terminal is connected to a base terminal of the bipolar transistor 100. An input signal is fed to the base terminal of the bipolar transistor 100 via an inverter 104 and is also fed to a base terminal of the bipolar transistor 101 via inverters 104 and 105. By this signal, the bipolar transistor 100 and bipolar transistor 101 are push-pull operated, so that the output voltage is switched to ground potential and high-voltage side source potential ($V_B$). In each of the inverters 104 and 105 shown in FIG. 11, a p-n junction-isolated bipolar transistor shown in FIG. 12 is used. That is, an n⁻ silicon layer 111 is formed on an n-type silicon substrate 110, and a p⁺ region 112 which reaches the n⁻ silicon substrate 110 is formed in the n⁻ silicon layer 111 in such a way that it surrounds an element formation region. In this element formation region (p-n junction isolation island), a buried n⁺ layer 113 is formed. In the surface layer portion of the n⁻ silicon layer 111 at the part of the element formation region (p-n junction isolation island), an n⁺ collector region 114 and a p⁺ base region 115 are formed standing separate from each other, and also an n⁺ emitter region 116 is formed in the p⁺ base region 115.

FIG. 13 shows waveforms on the input/output sides (α1, α2) of the inverter 104, a waveform on the output side (α3) of the inverter 105, and the ON/OFF state of the bipolar transistors 100 and 101. As shown in FIG. 13, there is a delay time τ in the bipolar transistor 100 when it is switched from ON to OFF. Hence, the moment the bipolar transistors 100 and 101 are turned ON simultaneously to come into a conducting state, a leak-through current I flows. Stated strictly, the leak-through current may inevitably flow unless at least either of the two transistors comes turned OFF. That is, where a circuit is set up which performs push-pull operation by means of two MOS transistors 120 and 121 as shown in FIG. 14, a condition may come in which as shown in FIG. 15 at least one of the two transistors 120 and 121 does not come turned OFF, at the time of which the leak-through current I flows. This leak-through current causes a trouble due to radio noise.

As a countermeasure therefor, the driving circuit disclosed in the above Japanese Patent Application Laid-open No. 2000-262042 employs a structure in which a circuit for phase control is added on the side of the base terminal of the bipolar transistor 101 shown in FIG. 11.

The addition of such a phase control circuit, however, may inevitably be a factor of enlargement of chip size.

SUMMARY OF THE INVENTION

The present invention was made under such technical backgrounds. Accordingly, an object of the present invention is to provide a driving circuit which has a novel structure and can keep the leak-through current from flowing through two push-pull operating switching transistors.

To achieve the above object, the present invention provides a driving circuit comprising a first conductivity type switching transistor (20 or 70) and a second conductivity type switching transistor (21 or 71) which are connected in series between high-voltage and low-voltage both source terminals, and a plurality of inverters provided on a path through which an input signal is transmitted to both the transistors; one of both the transistors being turned on, and the other being turned off, by means of the inverters to bring an output terminal connected between both the transistors, to any of a high voltage level and a low voltage level;

the inverters being each constituted of a bipolar transistor which is element-isolated by insulating layers (41 and 44) in a first conductivity type semiconductor substrate (46), and, in addition to inverters (24, 25, 27 and 28) each having in the first conductivity type semiconductor substrate a second conductivity type impurity-diffused region (50) for drawing out electric charges, inverters (26 and 29) which do not have the second conductivity type impurity-diffused region are provided in combination with the former.

Where two switching transistors connected in series are push-pull operated, both the switching transistors simultaneously come into a conducting state when one of the transistors is changed from OFF to ON, and the other is changed from ON to OFF, using the inverters in accordance with an input signal, whereupon a leak-through current is going to flow.

Here, compared with an inverter constituted of a bipolar transistor which is element-isolated by insulating layers in a semiconductor substrate and has in the semiconductor substrate an impurity-diffused region for drawing out electric charges, a delay in inverter's inverting operation comes in inverters which do not have such an impurity-diffused region. This causes a delay in operation of the switching transistors, so that the leak-through current can be kept from flowing through the two push-pull operating switching transistors.

In the above inverters which do not have the second conductivity type impurity-diffused region, the inverters may each be so designed as to have a current amplification of 5 or less. This is preferable in order to delay the inverting operation.

In the above inverters which do not have the second conductivity type impurity-diffused region, the inverters may each be so designed as to have a current amplification of 1 or less. This is more preferable in order to delay the inverting operation.

In one embodiment of the driving circuit of the present invention, the above first conductivity type switching transistor may be a p-n-p transistor and the second conductivity type switching transistor may be an n-p-n transistor.

In another embodiment of the driving circuit of the present invention, the above first conductivity type switching transistor may be a P-channel MOS transistor and the second conductivity type switching transistor may be an N-channel MOS transistor.

DESCRIPTION OF THE PREFERRED EMBODIMENTS

An embodiment which materializes the present invention is described below with reference to the accompanying drawings.

In this embodiment, the present invention is materialized in a charging pump booster circuit for driving a power element for loading electrification. The whole configuration of the circuit is shown in FIG. 1.

Figure 1:
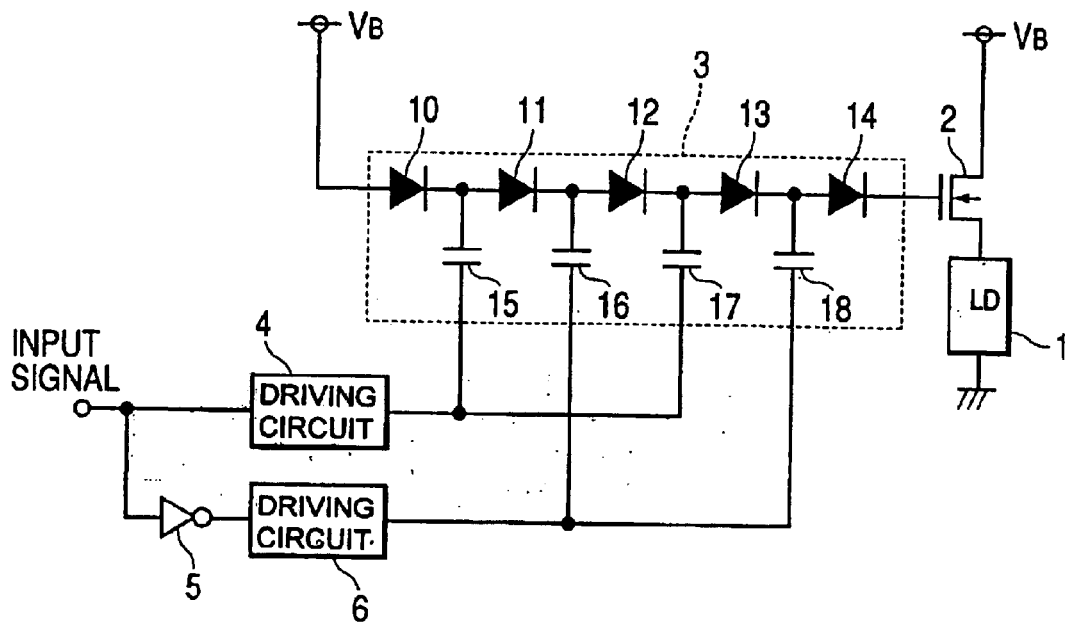
FIG. 1 is a circuit diagram showing the configuration of a charging pump booster circuit in which the driving circuit of the present invention may be used.

In the circuit shown in FIG. 1, a load 1 and a power MOS transistor 2 are connected in series between a high-voltage side source terminal ($V_B$) and a ground terminal. A charging pump 3 is also connected to a gate terminal of the power MOS transistor 2. The charging pump consists basically of diodes 10, 11, 12, 13 and 14 connected in series and capacitors 15, 16, 17 and 18 connected between the diodes 10 and 11, 11 and 12, 12 and 13, and 13 and 14, respectively. The diode 14 is connected on its cathode side to a gate terminal of the power MOS transistor 2. Meanwhile, the diode 10 is connected on its anode side to the high-voltage side source terminal ($V_B$).

The capacitors 15 and 17 are also connected to an input signal terminal via a driving circuit 4. The capacitors 16 and 18 are further connected to the input signal terminal via an inverter 5 and a driving circuit 6. The driving circuits 4 and 6 are configured in the same way. Their specific configuration is shown in FIG. 2.

Figure 2:
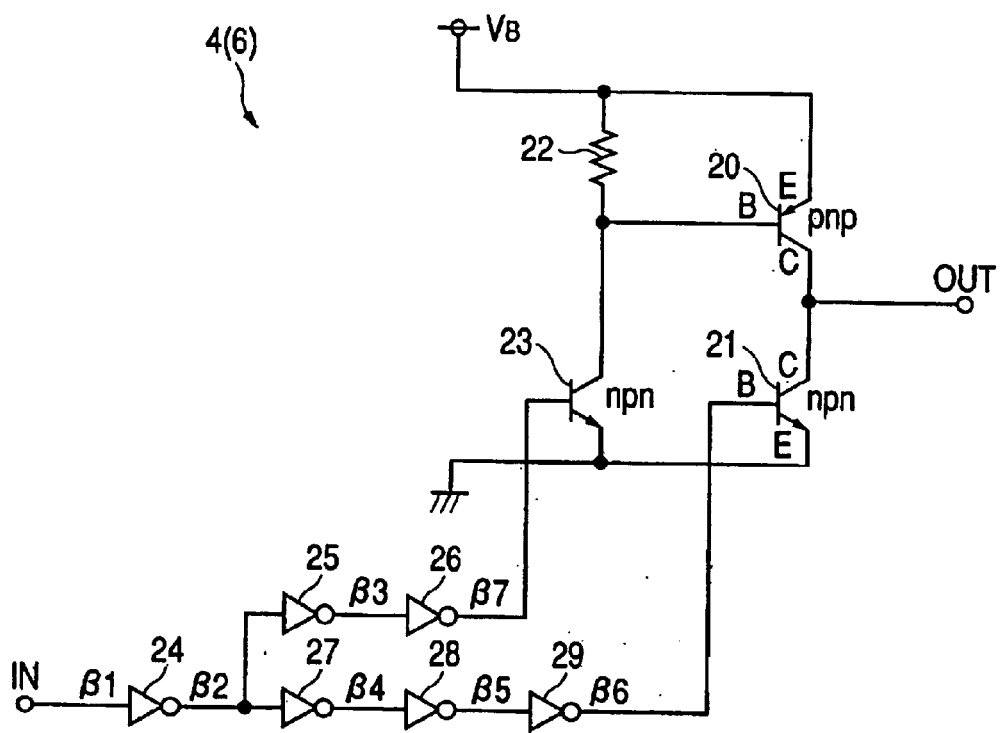
FIG. 2 is a circuit diagram showing the configuration of a driving circuit according to an embodiment of the present invention.

In the circuit shown in FIG. 2, a p-n-p transistor 20 for high-voltage side switching and an n-p-n transistor 21 for low-voltage side switching are connected in series between a high-voltage side source terminal ($V_B$) and a ground terminal. An output terminal is also connected between both the transistors 20 and 21. Meanwhile, a resistance element 22 and an n-p-n transistor 23 are connected in series between the high-voltage side source terminal ($V_B$) and the ground terminal, and a midpoint between the resistance element 22 and the n-p-n transistor 23 is connected to a base terminal of the p-n-p transistor 20.

To the input signal terminal shown in FIG. 2, a base terminal of the n-p-n transistor 23 is connected via inverters 24, 25 and 26. Then, the transistor 23 is turned ON by an input signal, and the base potential of the p-n-p transistor 20 is brought to a ground level, so that the transistor 20 is turned ON. Meanwhile, to the input signal terminal shown in FIG. 2, a base terminal of the n-p-n transistor 21 is connected via inverters 24, 27, 28 and 29. Then, the transistor 21 is turned ON by an input signal. Here, as operation of both the transistors 20 and 21, one of the p-n-p transistor 20 and the n-p-n transistor 21 comes into an on-state and at the same time the other comes into an off-state. As the result, the voltage of the output terminal (output voltage) is switched to ground potential and high-voltage side source potential ($V_B$).

Thus, the p-n-p transistor 20, which serves as a first conductivity type switching transistor, and the n-p-n transistor 21, which serves as a second conductivity type switching transistor, are connected in series between high-voltage and low-voltage both source terminals. Then, one of the transistors 20 and 21 are turned ON, and the other is turned OFF, by means of the inverters 24 to 29 provided on the path through which the input signal is transmitted to both the transistors, to bring to any of a high voltage level and a low voltage level the output terminal connected between both the transistors 20 and 21.

Figure 3:
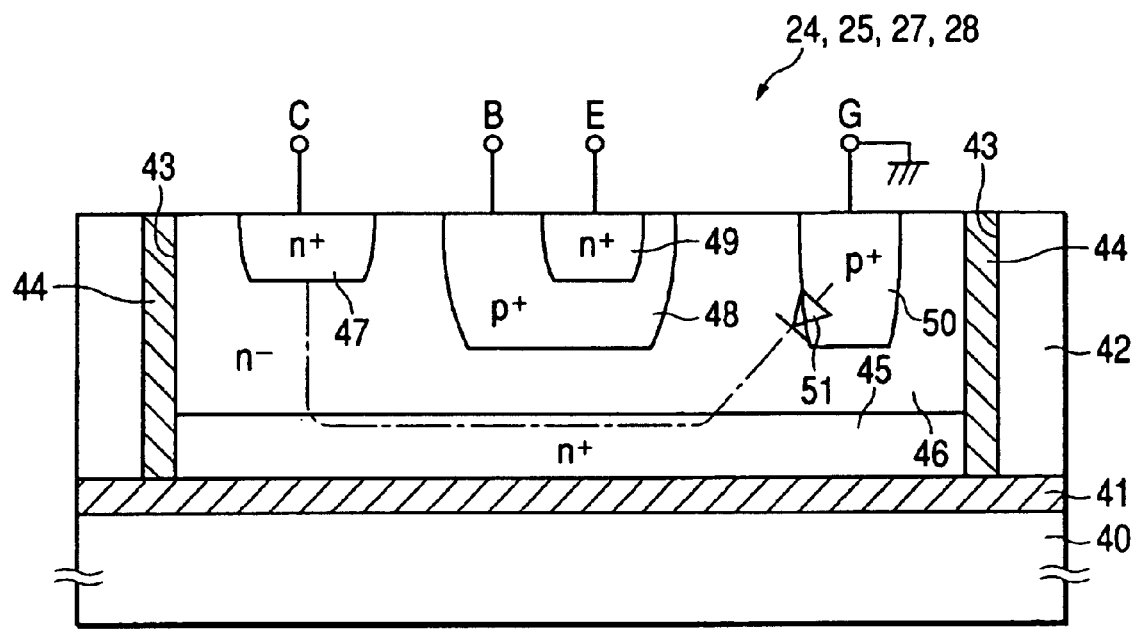
FIG. 3 is a vertical section of a bipolar transistor.
Figure 4:
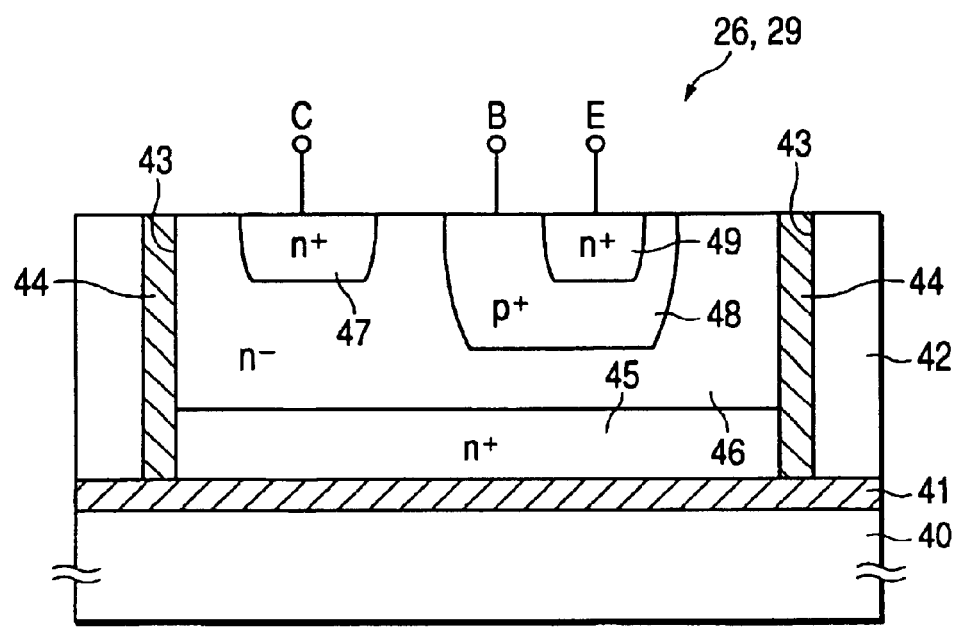
FIG. 4 is a vertical section of another bipolar transistor.

The inverters 24, 25, 27 and 28 shown in FIG. 2 are each constituted of a bipolar transistor shown in FIG. 3, and the inverters 26 and 29 also shown in FIG. 2 are each constituted of a bipolar transistor shown in FIG. 4.

In the bipolar transistor shown in FIG. 3, a thin-film silicon layer 42 is formed on a silicon substrate 40 via a silicon oxide film 41. A trench 43 is formed in the thin-film silicon layer 42 in such a way that it surrounds an element formation region, and the inside of the trench 43 is filled with a silicon oxide film 44. This element formation region (trench island) is constituted of an n⁻ silicon layer 46, and an n− silicon layer 45 is formed beneath it. In the surface layer portion (surface layer portion of the n⁻ silicon layer 46) of the element formation region (trench island), an n⁺ collector region 47 and a p⁺ base region 48 are formed standing separate from each other. An n⁺ emitter region 49 is formed in surface layer portion of the p⁺ base region 48.

In the surface layer portion (surface layer portion of the n⁻ silicon layer 46 as a semiconductor substrate) of the trench island, a p⁺ substrate region 50 is further formed, and this p⁺ substrate region 50 is grounded. The p⁺ substrate region 50 is an impurity-diffused region for drawing out electric charges having accumulated, and a parasitic diode 51 is formed at an interface between the p⁺ substrate region 50 and the n⁻ silicon layer 46. This parasitic diode 51 makes quick the switching operation from ON to OFF.

The bipolar transistor shown in FIG. 4 has the same configuration as that in FIG. 3 except that the p⁺ substrate region 50 shown in FIG. 3 is not provided. That is, a thin-film silicon layer 42 is formed on a silicon substrate 40 via a silicon oxide film 41. A trench 43 is formed in the thin-film silicon layer 42 in such a way that it surrounds an element formation region. The inside of the trench 43 is filled with a silicon oxide film 44. This trench island is constituted of an n⁻ silicon layer 46, and an n− silicon layer 45 is formed beneath it. In the surface layer portion (surface layer portion of the n⁻ silicon layer 46) of the trench island, an n⁺ collector region 47 and a p⁺ base region 48 are formed standing separate from each other. An n⁺ emitter region 49 is formed in the surface layer portion of the p⁺ base region 48. Here, since the p⁺ substrate region 50 shown in FIG. 3 is not provided, any parasitic diode is not formed in the transistor shown in FIG. 4. Since no parasitic diode is formed, the electric charges having accumulated in the p⁺ base region 48 are discharged with difficulty, so that the switching operation from ON to OFF is delayed.

Figure 12:
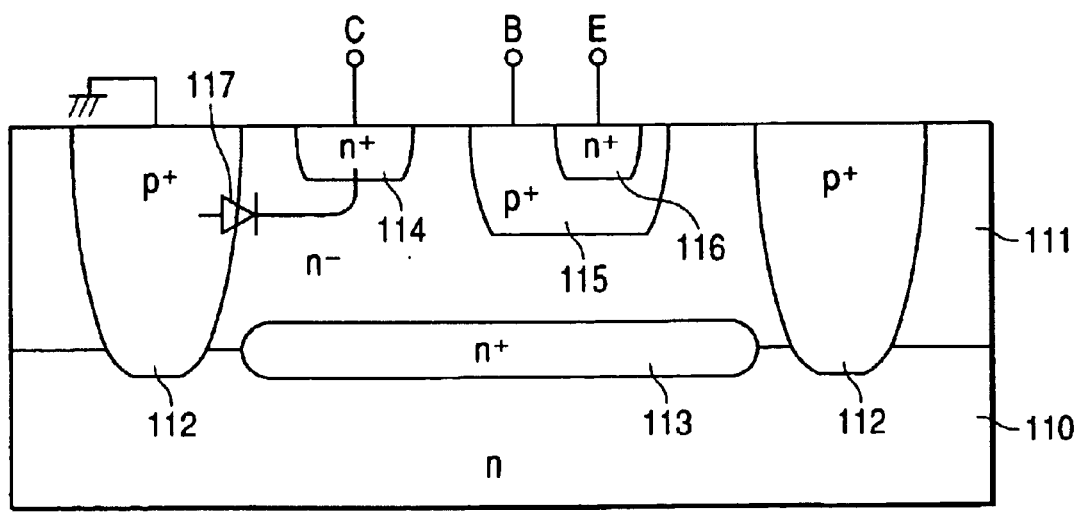
FIG. 12 is a vertical section of a bipolar transistor.
Figure 13:
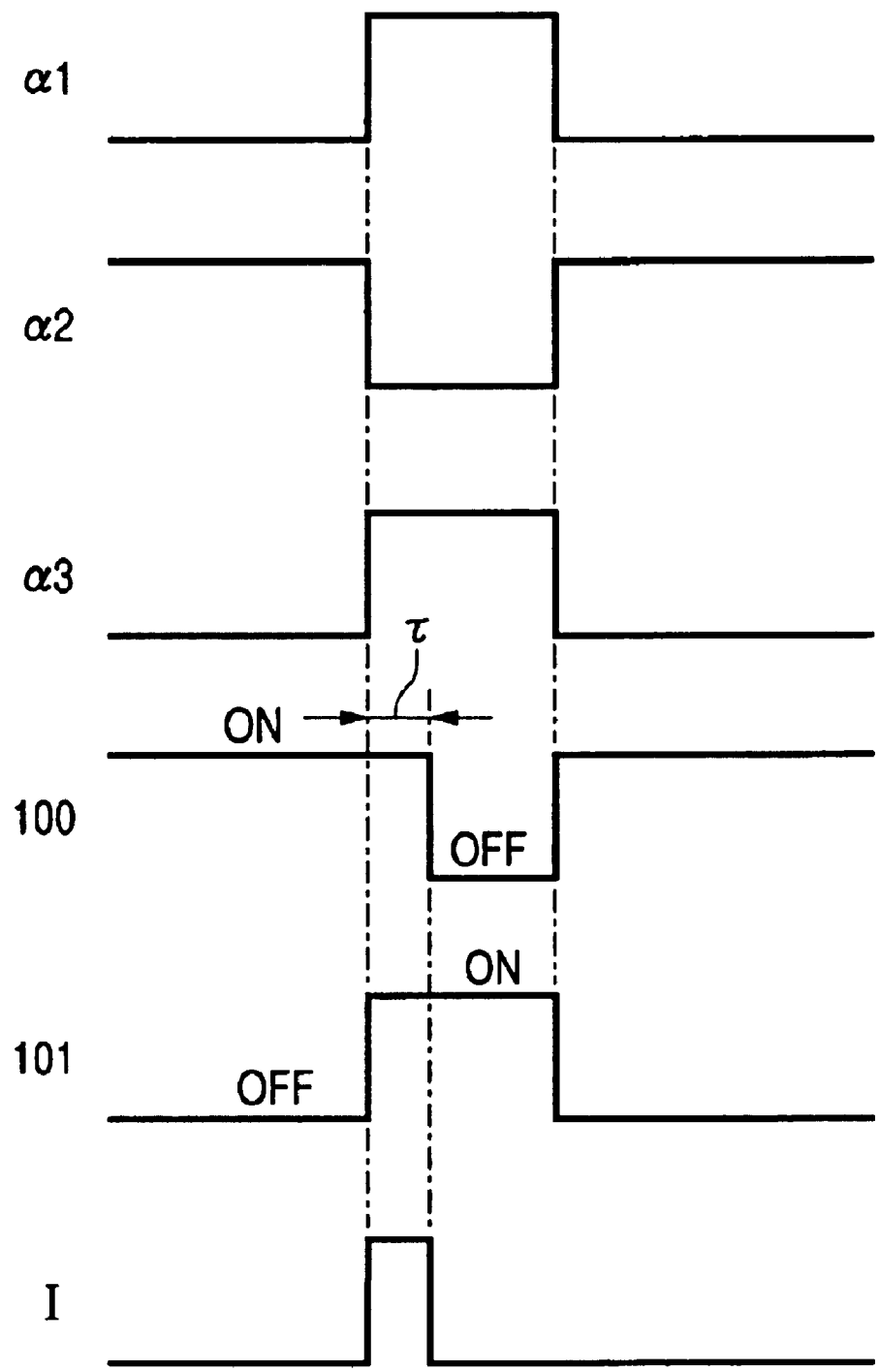
FIG. 13 is a time chart for describing the prior art.
Figure 14:
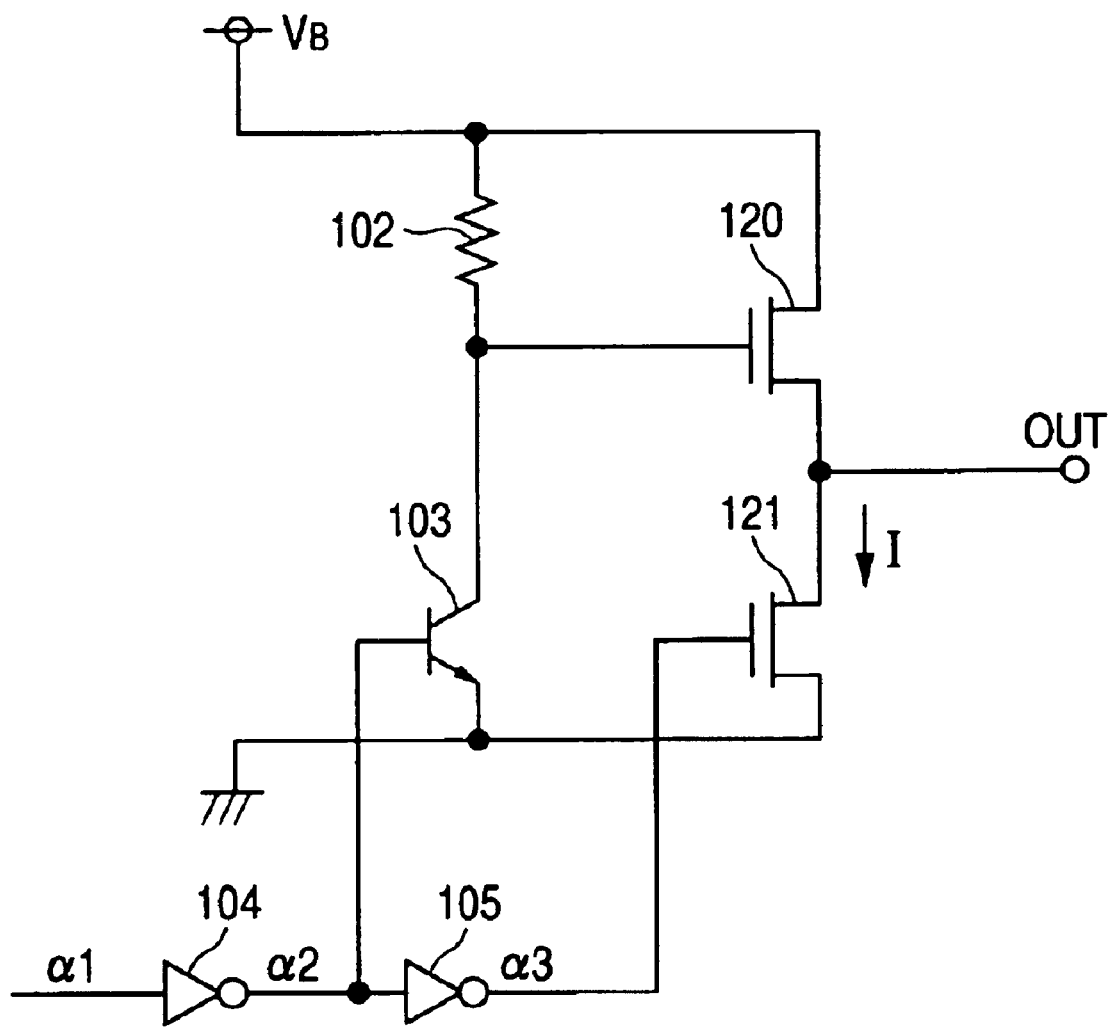
FIG. 14 is a circuit diagram showing the configuration of a driving circuit to describe the prior art.

Thus, the input signal terminals 26 and 29 shown in FIG. 2 (the transistors shown in FIG. 4) are n-p-n transistors which are not of a junction-isolated type but of an oxide-film-isolated type, and also the time of operation from ON to OFF is made late. That is, in the p-n junction-isolated bipolar transistor shown in FIG. 12, a parasitic diode 117 is formed at an interface between the p⁺ region 112 and the n⁻ layer 111. In the oxide-film-isolated type bipolar transistor shown in FIG. 3, the parasitic diode 51 to the substrate is also formed. These parasitic diodes 117 and 53 facilitate the discharge of electric charges having accumulated in the p⁺ base regions (115, 48), and make quick the switching operation from ON to OFF. On the other hand, the oxide-film-isolated type n-p-n transistors shown in FIG. 4 has no parasitic diode, and hence the electric charges having accumulated in the p⁺ base region 48 are discharged with difficulty, so that the switching operation from ON to OFF is delayed. Thus, the phase control is performed by the inverters 26 and 29 shown in FIG. 2.

Figure 5:
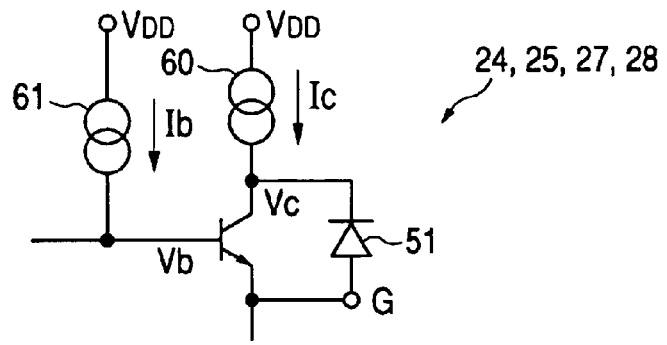
FIG. 5 is a diagram showing the configuration of an inverter making use of the bipolar transistor shown in FIG. 3.
Figure 6:
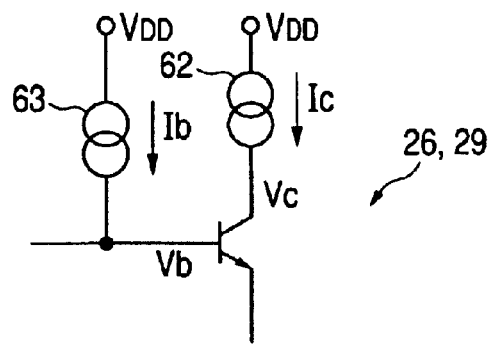
FIG. 6 is a diagram showing the configuration of an inverter making use of the bipolar transistor shown in FIG. 4.

FIG. 5 shows the configuration of the inverters 24, 25, 27 and 28 shown in FIG. 2 (the peripheral configuration of the transistor shown in FIG. 3). FIG. 6 also shows the configuration of the inverters 26 and 29 shown in FIG. 6 (the peripheral configuration of the transistor shown in FIG. 4).

In the inverters shown in FIGS. 5 and 6, the base terminal of the bipolar transistor is the input terminal, and the collector terminal is the output terminal. That is, when the input signal is at the L (low-voltage) level (when the base terminal is at the L level), the transistor comes turned OFF, and the output signal comes at the H (high-voltage) level. On the other hand, when the input signal is at the H level (when the base terminal is at the H level), the transistor comes turned ON, and the output signal comes at the L level. Also, as shown in FIG. 5, a constant current circuit 60 is connected to the collector terminal of the bipolar transistor, and a constant current circuit 61 to the base terminal. Similarly, as shown in FIG. 6, a constant current circuit 62 is connected to the collector terminal of the bipolar transistor, and a constant current circuit 63 to the base terminal.

Figure 7:
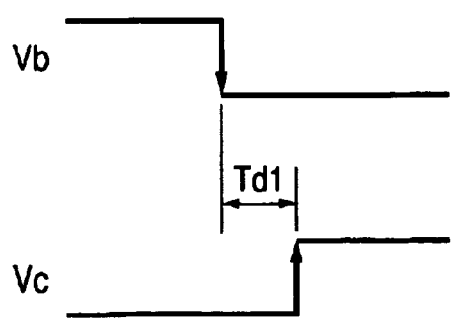
FIG. 7 is a diagram showing a change in collector voltage with respect to a change in base voltage.

Compared with the operation speed of the inverters 24, 25, 27 and 28 shown in FIG. 2 (the speed from ON to OFF in the transistor shown in FIG. 3), the operation speed of the inverters 26 and 29 shown in FIG. 2 (the speed from ON to OFF in the transistor shown in FIG. 4) is set lower. That is, as shown in FIG. 7, the time Td1 after the base voltage Vb has dropped and until the collector voltage Vc has risen is set longer. Stated in detail, in the case of FIG. 4 transistor, it is commonly so designed as to have a current amplification $h_{FE}$ (=collector current Ic/base current Ib) of about 10, where the delay Td1 shown in FIG. 7 is 0.2 μs. However, in this embodiment, the collector current Ic and the base current Ib are regulated to make the transistor have a current amplification $h_{FE}$ of 0.1, whereby the delay Td1 shown in FIG. 7 is made to be 2 μs. Thus, in the present invention, the oxide-film-isolated type bipolar transistor having no parasitic diode is used, and the current amplification $h_{FE}$ is made smaller (1 or less) to make the delay time longer.

In the case of the FIG. 3 transistor, it is used at a current amplification $h_{FE}$ of about 10 as commonly so designed, where the delay Td1 shown in FIG. 7 is 0.2 μs. This is because the delay Td1 shown in FIG. 7 comes only to be 0.2 μs even if the collector current Ic and the base current Ib are regulated to make the transistor have a current amplification $h_{FE}$ of 0.1.

How the driving circuits 4 and 6 operate is described below with reference to the time chart in FIG. 8.

Figure 8:
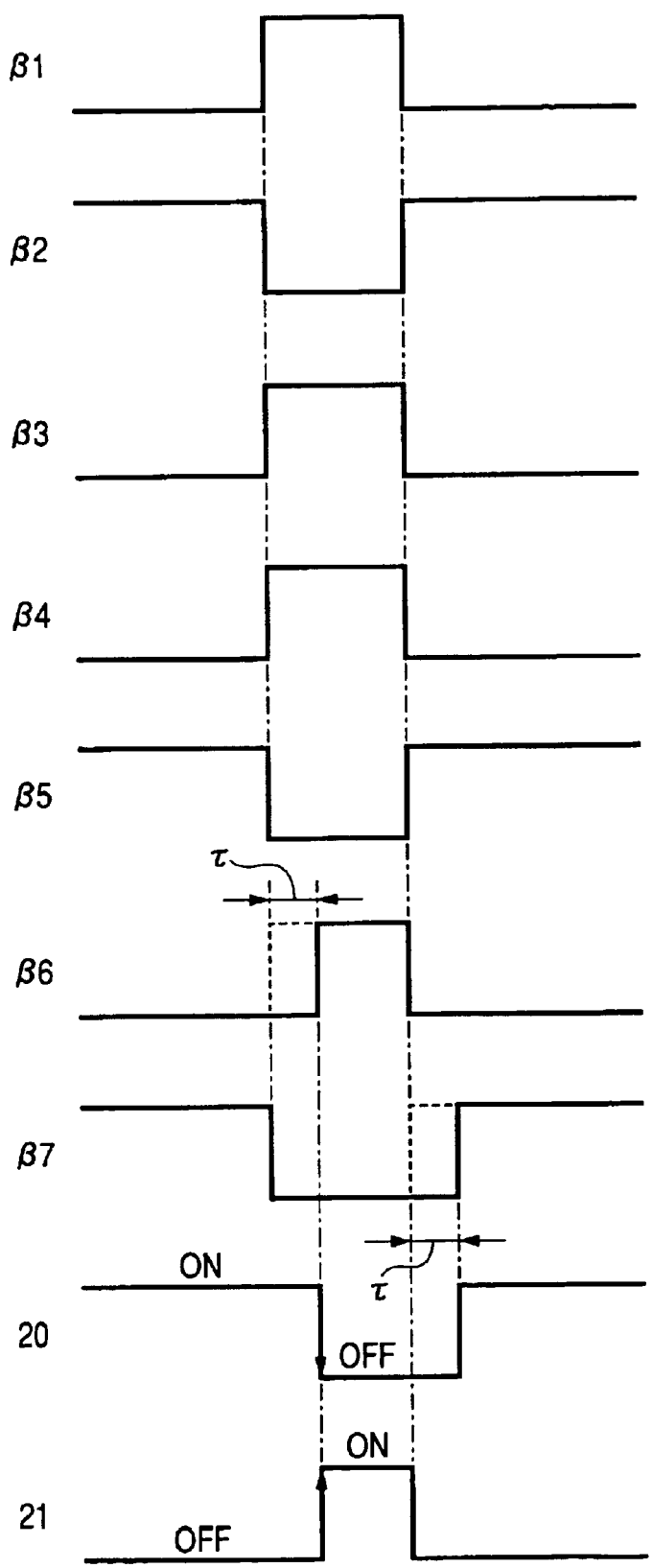
FIG. 8 is a time chart for describing how the driving circuit operates.

In FIG. 8, shown are, from the top, waveform on the input side (β1) of the inverter 24 shown in FIG. 2, waveform on the output side (β2) of the inverter 24, waveform on the output side (β3) of the inverter 25, waveform on the output side (β4) of the inverter 27, waveform on the output side (β5) of the inverter 28, waveform on the output side (β6) of the inverter 29, waveform on the output side (β7) of the inverter 26, on-off operating state of the p-n-p transistor 20, and on-off operating state of the n-p-n transistor 21.

In the inverters 24, 25, 27 and 28 shown in FIG. 2 (the transistor shown in FIG. 3), quick signal-inverting operation is performed. On the other hand, in the inverters 26 and 29 shown in FIG. 2 (the transistor shown in FIG. 4), they show a delayed operation as the operation of from ON to OFF of the transistors. As the result, as shown by the waveform on the β6 side, the signal rises with a delay by τ. Hence, as operation at the time the delay τ has come in the operation of the p-n-p transistor 20 with respect to the waveform on the β7 side, the n-p-n transistor 21 also operates with a delay by τ. Therefore, the n-p-n transistor 21 comes turned OFF when the p-n-p transistor 20 is turned ON, where any leak-through current does not flow. That is, the p-n-p transistor 20 and the n-p-n transistor 21 are not turned ON simultaneously, where any leak-through current does not flow.

It has been ascertained that, when the present driving circuit is used in the bipolar type charging pump booster circuit shown in FIG. 1, radio noise is reduced by 5 to 10 dBm.

As described above, in the present invention, the inverters are each constituted of the bipolar transistor which is element-isolated by the insulating layers silicon oxide films 41 and 44 in the first conductivity type semiconductor substrate n⁻ silicon layer 46, and, in addition to the inverters 24, 25, 27 and 28 each having in the substrate (n⁻ silicon layer 46) the second conductivity type impurity-diffused region p⁺ substrate region 50 for drawing out electric charges, the inverters 26 and 29 which do not have such a second conductivity type impurity-diffused region are provided in combination with the former. Where the two switching transistors (switching transistors) 20 and 21 connected in series are push-pull operated, both the switching transistors 20 and 21 simultaneously come into a conducting state when one of the transistors 20 and 21 is changed from OFF to ON, and the other is changed from ON to OFF, using the inverters in accordance with an input signal, whereupon the leak-through current is going to flow. Stated in detail, as shown in FIG. 8, a delay in operation comes in the p-n-p transistor 20 when the n-p-n transistor 21 is changed from OFF to ON or the p-n-p transistor 20 is changed from ON to OFF, whereupon the leak-through current is going to flow. Here, compared with the inverters 24, 25, 27 and 28 each constituted of the bipolar transistor which is element-isolated by the silicon oxide films (insulating layers) 41 and 44 in the n⁻ silicon layer (semiconductor substrate) 46 and has in the n⁻ silicon layer (semiconductor substrate) 46 the p⁺ substrate region (impurity-diffused region) 50 for drawing out electric charges, a delay in inverter's inverting operation comes in the inverters 26 and 29 which do not have the p⁺ substrate region. This causes a delay in operation of from OFF to ON in the n-p-n transistor 21, so that the leak-through current can be kept from flowing through the two push-pull operating transistors 20 and 21.

Here, in the above inverters 26 and 29 which do not have the p⁺ substrate region (impurity-diffused region) 50, the inverters may each be so designed as to have a current amplification $h_{FE}$ of 5 or less. This is preferable in order to delay the inverting operation. In particular, the inverters may more preferably be made to have a current amplification $h_{FE}$ of 1 or less. That is, when the one not provided with the p⁺ substrate region (50) is used in the oxide-film-isolated type n-p-n transistor, the delay time in the operation of from ON to OFF changes greatly, depending on the current amplification $h_{FE}$ which is a collector/base current ratio. Taking account of this, the leak-through current can be made to flow with difficulty by using the inverters 26 and 29 whose $h_{FE}$ value has been controlled to make it small.

Incidentally, the same effect is obtainable also when the position of the inverter 29 is changed for that of the inverter 27.

Figure 9:
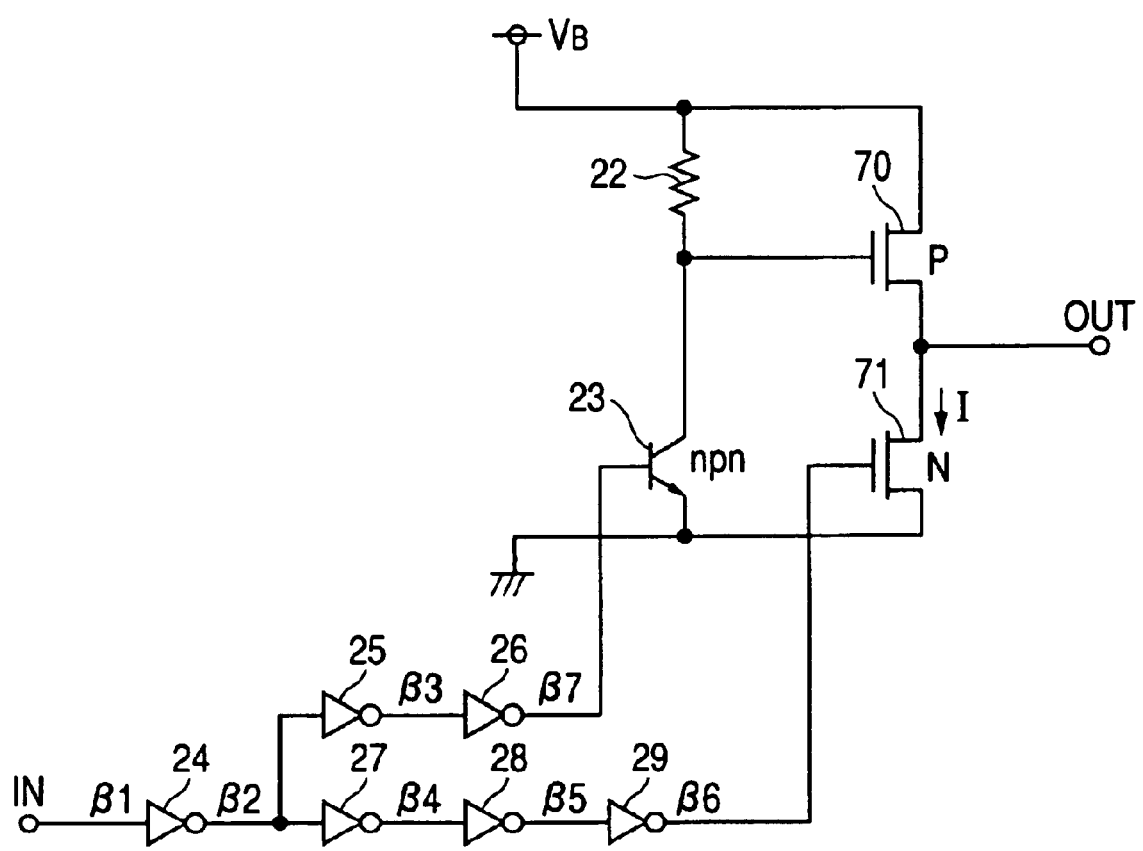
FIG. 9 is a circuit diagram showing the configuration of a driving circuit according to another embodiment of the present invention.
Figure 10:
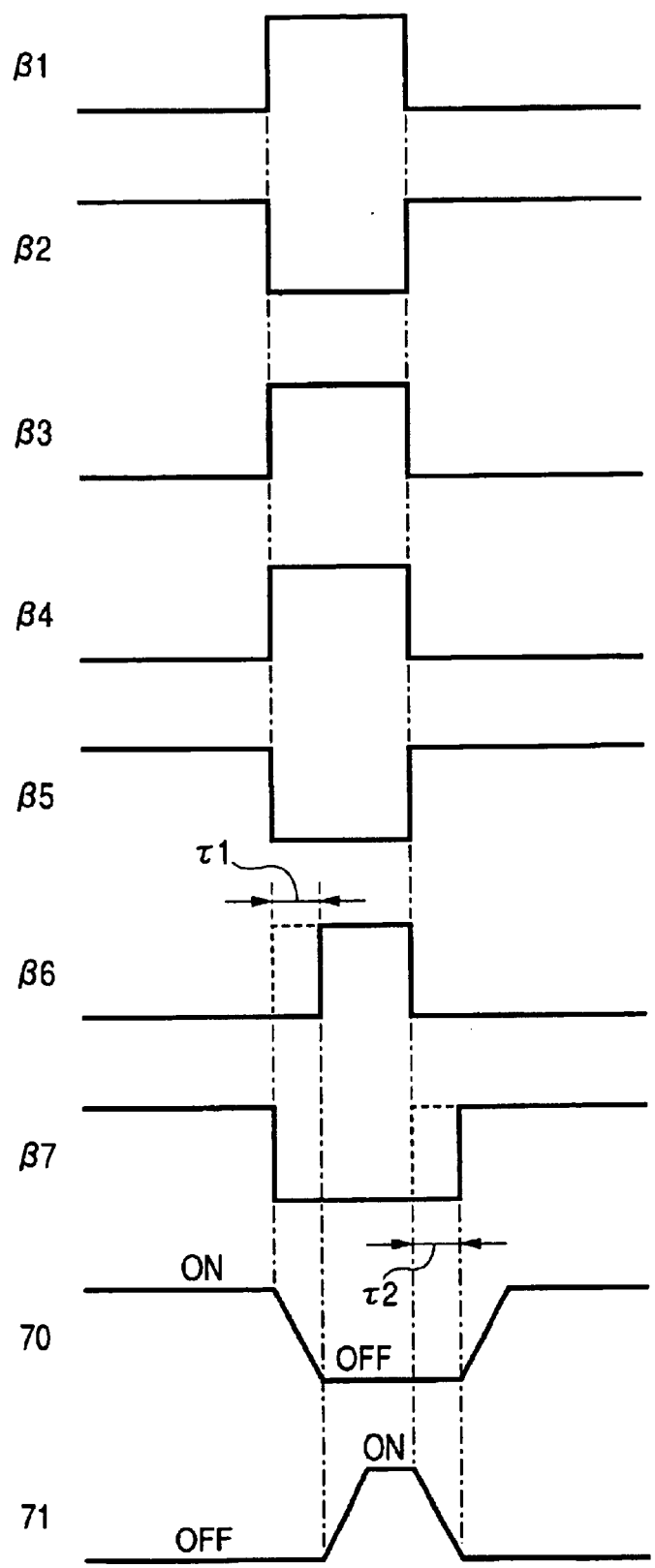
FIG. 10 is a time chart for describing how the driving circuit operates.
Figure 11:
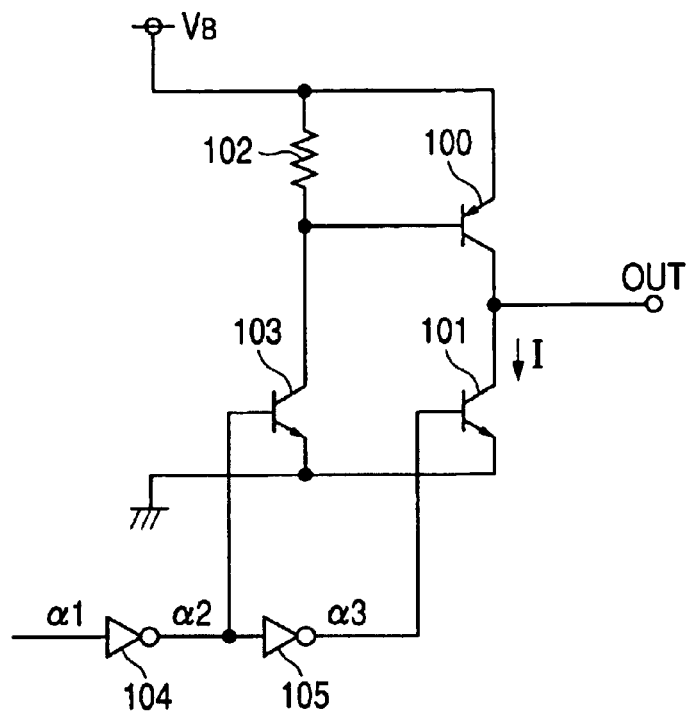
FIG. 11 is a circuit diagram showing the configuration of a driving circuit to describe the prior art.
Figure 15:
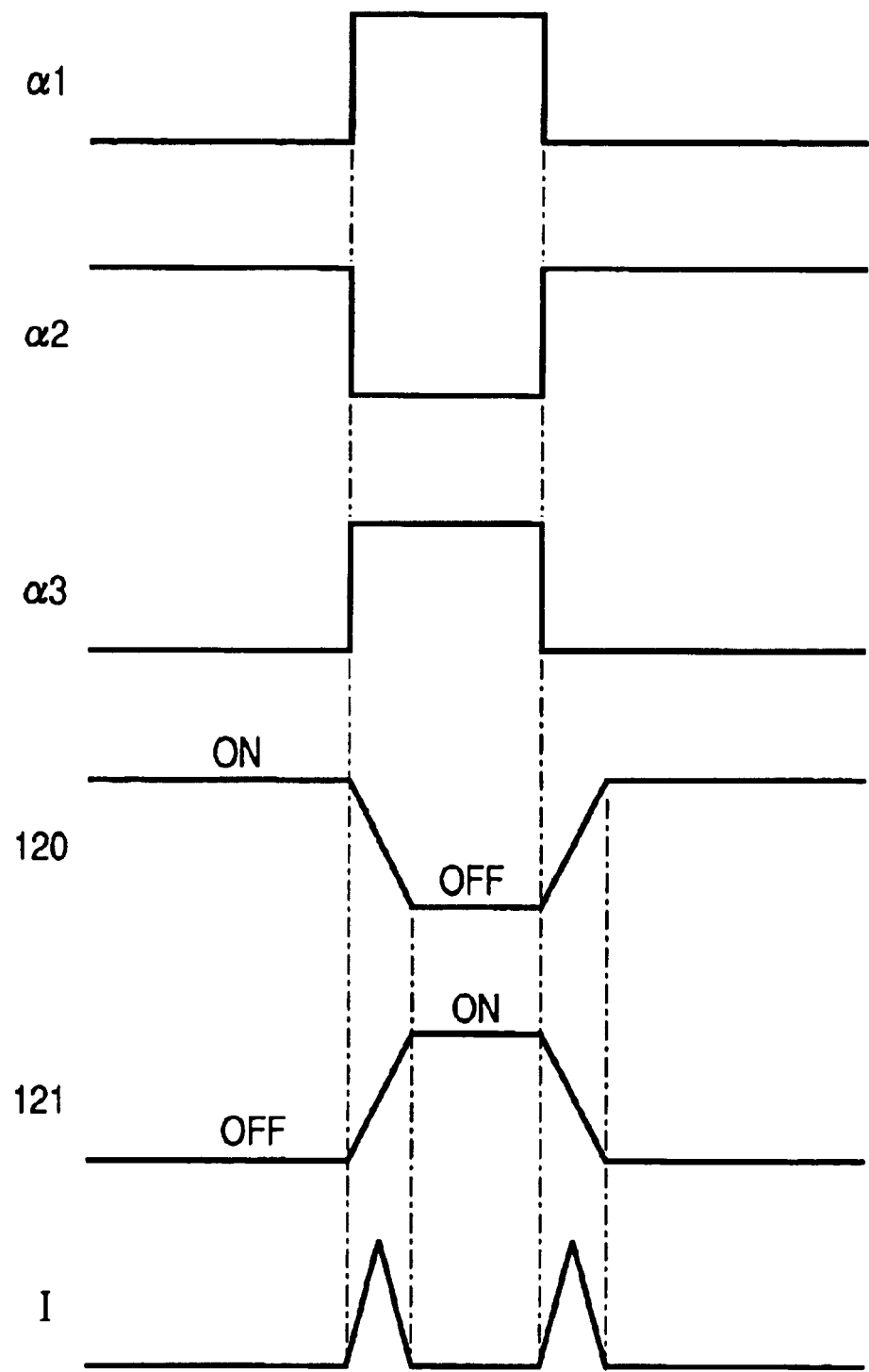
FIG. 15 is a time chart for describing the prior art.

In the foregoing description, a case has been described in which the bipolar transistors 20 and 21 are used as the switching transistors. The present invention may also be applied in a case in which, as shown in FIG. 9, a P-channel MOS transistor (first conductivity type switching transistor) 70 and an N-channel MOS transistor (second conductivity type switching transistor) 71 are used. That is, where as shown in FIG. 9 a circuit is set up which performs push-pull operation by means of the two MOS transistors 70 and 71 as shown in FIG. 9, a condition may come in which as shown in FIG. 15 at least one of the two transistors 70 and 71 does not come turned OFF, at the time of which the leak-through current I is going to flow. However, in the case shown in FIG. 9, the condition in which at least one of the two transistors 70 and 71 does not come turned OFF does not come and the leak-through current does not flow as shown in FIG. 10 time chart, because the inverters 26 and 29 (the transistor shown in FIG. 4) are provided in addition to the inverters 24, 25, 27 and 28 (the inverter shown in FIG. 3). Stated in greater detail, an operation delay τ1 comes at β6 because of a delay in the inverter 29, and the transistor 71 is turned OFF when the transistor 70 is not ON, so that any leak-through current does not flow. An operation delay τ2 also comes at β7 because of a delay in the inverter 26, and the transistor 70 is turned OFF when the transistor 71 is not OFF, so that any leak-through current does not flow.

What is claimed is:

1. A driving circuit comprising:
   a first conductivity type switching transistor and a second conductivity type switching transistor which are connected in series between high-voltage and low-voltage source terminals, and a plurality of inverters provided on a path through which an input signal is transmitted to the transistors; one of the transistors being turned on, and the other being turned off, by means of the inverters to bring an output terminal connected between both the transistors, to a high voltage level or a low voltage level;
   said inverters being provided in a transmission path of the first conductivity type switching transistor and in a transmission path of the second conductivity type switching transistor, and each of said inverters comprising a bipolar transistor which is element-isolated by insulating layers in a first conductivity type semiconductor substrate, and, in addition to inverters each having in the first conductivity type semiconductor substrate a second conductivity type impurity-diffused region for drawing out electric charges, an inverter which does not have the second conductivity type impurity-diffused region is provided in combination with the former in each of the transmission path of the first conductivity type switching transistor and the transmission path of the second conductivity type switching transistor.

2. The driving circuit according to claim 1, wherein, in the inverters which do not have the second conductivity type impurity-diffused region, said inverters are each designed so as to have a current amplification of 5 or less.

3. The driving circuit according to claim 1, wherein, in the inverters which do not have the second conductivity type impurity-diffused region, said inverters are each designed so as to have a current amplification of 1 or less.

4. The driving circuit according to claim 1, wherein said first conductivity type switching transistor is a p-n-p transistor and said second conductivity type switching transistor is an n-p-n transistor.

5. The driving circuit according to claim 1, wherein said first conductivity type switching transistor is a P-channel MOS transistor and said second conductivity type switching transistor is an N-channel MOS transistor.

6. The driving circuit according to claim 1, further comprising a parasitic diode formed at an interface between the impurity-diffused region in the bipolar transistor of said inverters.

7. The driving circuit according to claim 1, wherein a switching operation from ON to OFF in the bipolar transistor of said inverters is delayed.

8. The driving circuit according to claim 1, wherein said first conductivity type switching transistor and said second conductivity type switching transistor are utilized in connection with a pump booster circuit.

9. The driving circuit according to claim 8, wherein the pump booster circuit is of a bipolar type charging pump booster circuit.

10. The driving circuit according to claim 1, wherein the insulating layers comprise silicon oxide.

11. A driving circuit comprising:
    a first conductivity type switching transistor and a second conductivity type switching transistor which are connected in series between high-voltage and low-voltage source terminals, and a plurality of inverters provided on a path through which an input signal is transmitted to the transistors; one of the transistors being turned on, and the other being turned off, by means of the inverters to bring an output terminal connected between both the transistors, to a high voltage level or a low voltage level;
    said inverters being provided in a transmission path of the first conductivity type switching transistor and in a transmission path of the second conductivity type switching transistor, and each of said inverters comprising a bipolar transistor which is element-isolated by insulating layers in a first conductivity type semiconductor substrate, and, in addition to inverters each having in the first conductivity type semiconductor substrate a second conductivity type impurity-diffused region for drawing out electric charges, an inverter which does not have the second conductivity type impurity-diffused region is provided in combination with the former in each of the transmission path of the first conductivity type switching transistor and the transmission path of the second conductivity type switching transistor;
    wherein said first conductivity type switching transistor is a p-n-p transistor and said second conductivity type switching transistor is an n-p-n transistor.

12. The driving circuit of claim 11, wherein, in the inverters which do not have the second conductivity type impurity-diffused region, said inverters are each designed so as to have a current amplification of 5 or less.

13. The driving circuit according to claim 11, wherein, in the inverters which do not have the second conductivity type impurity-diffused region, said inverters are each designed so as to have a current amplification of 1 or less.

14. The driving circuit according to claim 11, wherein said first conductivity type switching transistor is a P-channel MOS transistor and said second conductivity type switching transistor is an N-channel MOS transistor.

15. The driving circuit according to claim 11, wherein said first conductivity type switching transistor and said second conductivity type switching transistor are utilized in connection with a pump booster circuit.

16. The driving circuit according to claim 15, wherein the pump booster circuit is of a bipolar type charging pump booster circuit.

* * * * *